United States Patent
Narendrnath et al.

(10) Patent No.: US 6,481,886 B1
(45) Date of Patent: Nov. 19, 2002

(54) APPARATUS FOR MEASURING PEDESTAL AND SUBSTRATE TEMPERATURE IN A SEMICONDUCTOR WAFER PROCESSING SYSTEM

(75) Inventors: Kadthala R. Narendrnath, San Jose, CA (US); Liang-Guo Wang, Milpitas, CA (US); Shamouil Shamouilian, San Jose, CA (US); Paul E. Luscher, Sunnyvale, CA (US); Hamid Noorbakhsh, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/513,726

(22) Filed: Feb. 24, 2000

(51) Int. Cl.[7] .............................. G01K 1/14; G01K 1/16; G01K 11/20; G02B 6/122; G02B 6/36; H01J 63/04

(52) U.S. Cl. ...................... 374/141; 385/88; 250/458.9; 374/121; 374/120; 374/161

(58) Field of Search ............................. 374/141, 142, 374/161, 208, 194, 120, 121; 250/458.9, 459.1, 461.1; 385/88, 31, 35, 33

(56) References Cited

U.S. PATENT DOCUMENTS

| | | | | | |
|---|---|---|---|---|---|
| 2,838,935 A | * | 6/1958 | Di Cecio et al. | ............ | 374/208 |
| 5,106,200 A | * | 4/1992 | Hosokawa | ................... | 374/121 |
| 5,107,445 A | | 4/1992 | Jensen et al. | ................ | 364/525 |
| 5,380,092 A | * | 1/1995 | Alain | ......................... | 374/60 |
| 5,470,155 A | | 11/1995 | Jensen | ........................ | 374/161 |
| 5,642,717 A | * | 7/1997 | Gilman et al. | ............... | 123/481 |
| 5,791,782 A | * | 8/1998 | Wooten et al. | ............... | 374/208 |
| 5,882,305 A | * | 3/1999 | Dumoulin et al. | .......... | 600/421 |
| 5,893,643 A | * | 4/1999 | Kumar et al. | ................ | 374/131 |
| 5,969,639 A | * | 10/1999 | Lauf et al. | ............. | 340/870.17 |
| 6,084,215 A | * | 7/2000 | Furuya et al. | ........... | 219/444.1 |
| 6,126,744 A | * | 10/2000 | Hawkins et al. | ............. | 117/85 |
| 6,140,612 A | * | 10/2000 | Husain et al. | .............. | 219/390 |
| 6,222,168 B1 | * | 4/2001 | Witonsky et al. | ........... | 219/687 |
| 6,226,453 B1 | * | 5/2001 | Yam et al. | ................... | 392/418 |
| 6,231,230 B1 | * | 5/2001 | Baldock et al. | ............. | 374/208 |

FOREIGN PATENT DOCUMENTS

JP 61256743 * 11/1986

OTHER PUBLICATIONS

Wickersheim et al. "Phosphors and Fiber Optics Remove Doubt from Difficult Temperature Measurements" Luxtron Corporation, Reprinted from Research & Development, Nov. 1985.

Wickersheim et al. "Fiberoptic Thermometry and Its Applications", J. Microwave Power, pp. 85–94, 1987.

* cited by examiner

Primary Examiner—Diego Gutierrez
Assistant Examiner—Gail Verbitsky
(74) Attorney, Agent, or Firm—Moser Patterson Sheridan; Joseph Bach

(57) ABSTRACT

Apparatus for measuring wafer support assembly temperature in a semiconductor wafer processing system. The apparatus is a modular plug that is mounted to the support assembly. The plug contains a photoluminescent material that exhibits a decay in luminescence after an excitement which is indicative of the temperature of the support assembly.

24 Claims, 2 Drawing Sheets

APPARATUS FOR MEASURING PEDESTAL AND SUBSTRATE TEMPERATURE IN A SEMICONDUCTOR WAFER PROCESSING SYSTEM

BACKGROUND OF THE INVENTION

1. Field of the Invention

The invention relates generally to an apparatus used to measure operating conditions inside a semiconductor wafer processing chamber and, more specifically, to an apparatus for measuring pedestal temperatures by detecting light emissions from a modular component.

2. Description of the Background Art

The materials and processes used to process a semiconductor wafer in a semiconductor wafer processing system are highly sensitive to temperature changes. Should these materials be exposed to excessive temperatures or gradients resulting from poor heat stabilization or transfer, yield or performance of the end product wafer is compromised. For example, if process temperatures are not properly controlled, processes such as etch selectivity and deposition reactions are compromised, along with a degradation in process uniformity. As a result, the circuitry formed upon the wafer are defectively constructed and/or suffer unacceptable variations between devices.

A substrate support, or pedestal, residing in a semiconductor wafer processing chamber is in intimate contact with the wafer and serves both as a heat sink and substrate support. Most pedestals are cooled by conduction to a liquid cooled base where a constant flow of coolant removes excess heat. It has been found that measuring the temperature of the pedestal provides a good indication of the wafer temperature. As such, different means of measuring the pedestal temperature are known in the prior art. One method of determining pedestal temperature is to measure the temperature of the coolant at an outlet of the base. Unfortunately, this method is limited in that the measured temperature is neither an accurate nor timely measure of the pedestal temperature. The coolant temperature in the base is measured after the coolant has passed through several interfaces, conduits, and heat sinks. Use of such unreliable, delayed data (i.e., as a temperature control feedback system parameter) renders wafer temperature stabilization difficult.

A second technique employs a temperature sensitive phosphor sensor. Phosphors used for temperature measurement typically can be grouped into two different categories. The first group emits a fluorescent glow dependent upon the temperature of the phosphor. The second group emits a glow activated by a predetermined impulse of energy, i.e., an exiting pulse of light, and following the activation, exhibit a decay in fluorescence that can be correlated to the temperature of the material. The sensor is mounted inside the chamber with a fiber optic cable which can be either attached to or viewed remotely from the sensor. The fluorescent glow "signal" is then transmitted by the fiber optic cable for monitoring purposes. However, as such systems are hard-mounted to the pedestal, the harsh environment within the chamber often contributes to a short service life. Once the probe is damaged, or conversely, if the pedestal suffers a problem requiring service, both the pedestal and probe must be replaced. This contributes to undue expense and unwelcome down time for system maintenance.

A third technique involves diffused reflectance spectroscopy. A wavelength of light reflected from the wafer surface is chosen for monitoring. A spectrometer measures the level of backscattering of the chosen wavelength (with specific energy and related temperature characteristics) to derive a wafer temperature. However, this approach is susceptible to erroneous measurements from energy received from other "hot" surfaces proximate the measuring equipment.

A fourth technique attempts to measure the pedestal temperature directly during wafer processing by placing thermocouple probes in contact with the pedestal. However, thermocouple probes placed in direct contact with the pedestal are unfortunately subjected to RF interference from a plasma used to process the wafer. As such, it is difficult to obtain an accurate temperature measurement by this approach as well. Thermocouple probes are also cumbersome to install and secure to a pedestal. For example, a small, narrow bore must be formed in the pedestal which is difficult to manufacture. Additionally, as the thermal couple is typically cemented or otherwise adhered to the pedestal at the bottom of the bore, replacement of the thermal couple requires extensive rework and down time.

Therefore, there exists a need in the art for an apparatus that can provide an accurate, real-time measurement of pedestal temperature with a relatively simple and rugged, modular design to withstand a processing chamber environment and facilitate rapid servicing or replacement.

SUMMARY OF THE INVENTION

The disadvantages heretofore associated with the prior art are overcome by an apparatus for measuring pedestal temperature in a wafer processing system. The inventive apparatus for measuring a temperature of a pedestal comprises a photoluminescent material disposed on a modular plug. The photoluminescent material decays in luminescence after being exposed to an excitation signal. The rate of decay is indicative of the temperature of the support assembly. The plug is removably disposed in a substrate support assembly to measure the temperature thereof.

The plug is threaded into a plate of the support assembly, thus allowing the plug to be easily removed when either the plug or support assembly requires service. Additionally, the plug is calibrated prior to installation, independent of the probe used to trigger and measure the response. This allows for improved serviceability and the ability to cost effectively retrofit existing processing systems.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical element that are common to the figures.

DETAIL DESCRIPTION OF INVENTION

Figure 1:
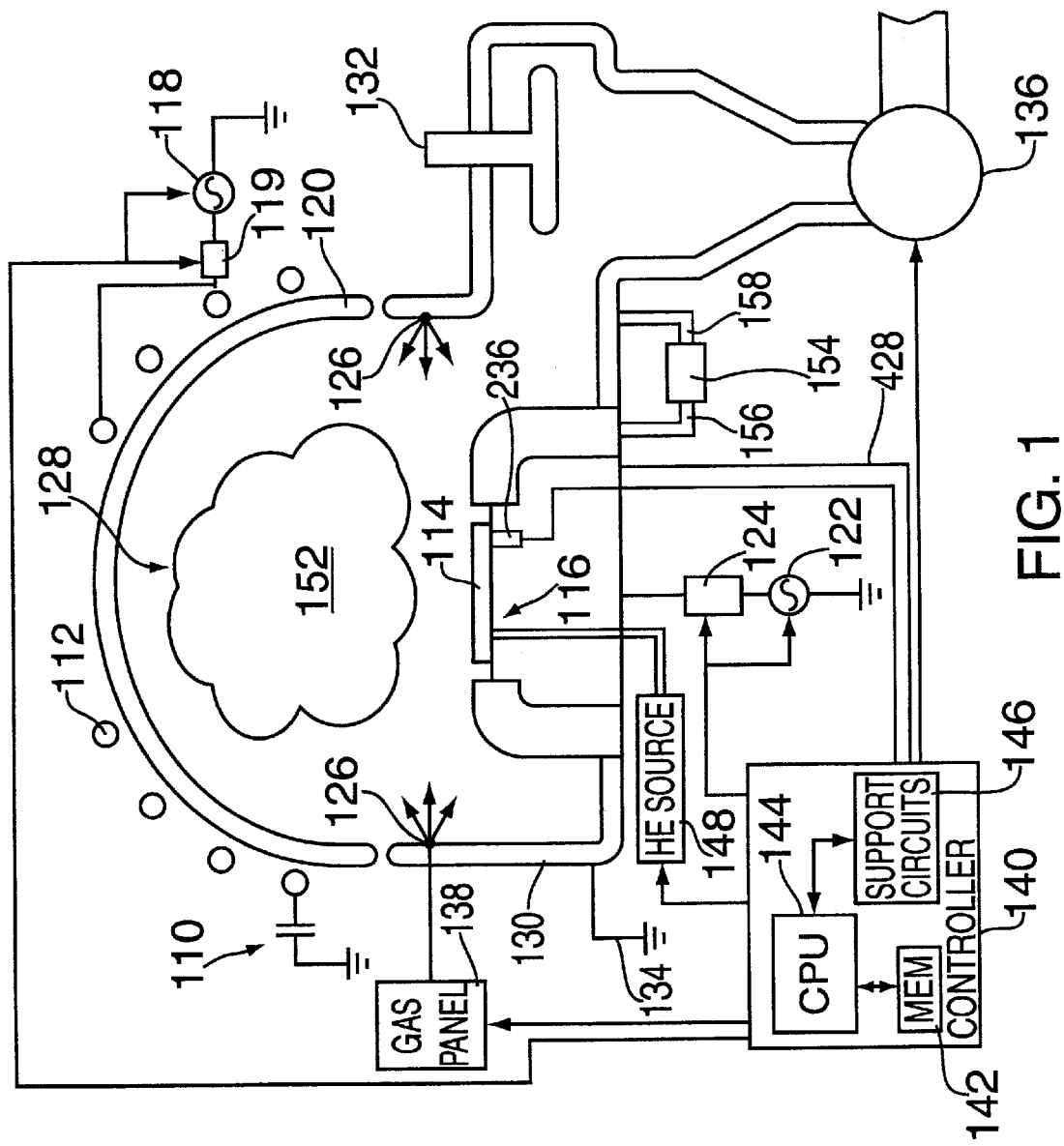
FIG. 1 is a schematic of an illustrative semiconductor processing chamber containing a support assembly in accordance with the subject invention.

The present invention is part of a semiconductor processing system 100 depicted in FIG. 1. An illustrative example of such a system is a Decoupled Plasma Source (DPS) Centura® etch system, available from Applied Materials, Inc. of Santa Clara, Calif., and described in U.S. Pat. No. 5,583,737. Other chambers, such as capacitively coupled chambers, can be used. The system 100 has a substrate support assembly 116 for supporting and maintaining a semiconductor substrate or wafer 114 at a predetermined temperature during wafer processing. The inventive support assembly 116 has utility in any number of semiconductor processing systems where temperature control and temperature uniformity of the wafer 114 is required. One skilled in the art will appreciate that the teachings disclosed herein are readily adaptable for use in various other applications (e.g., physical and chemical vapor deposition semiconductor processing systems) where temperature control and uniformity of the wafer 114 is required.

A support assembly 116 is disposed within a process chamber 110. The support assembly 116 has a probe assembly 236 that is coupled to a controller 140.

A fluid supply 154 is coupled to the support assembly 116 and passages (not shown) in walls 130 of the chamber 110 flow coolant therein to assist in regulating the temperature of the support assembly 116 and the chamber walls 130.

The controller 140 typically comprises a central processing unit (CPU), a memory, and support circuits for the CPU. The controller 140 is coupled to the various components of the chamber 110 to facilitate control of wafer processing.

Figure 2:
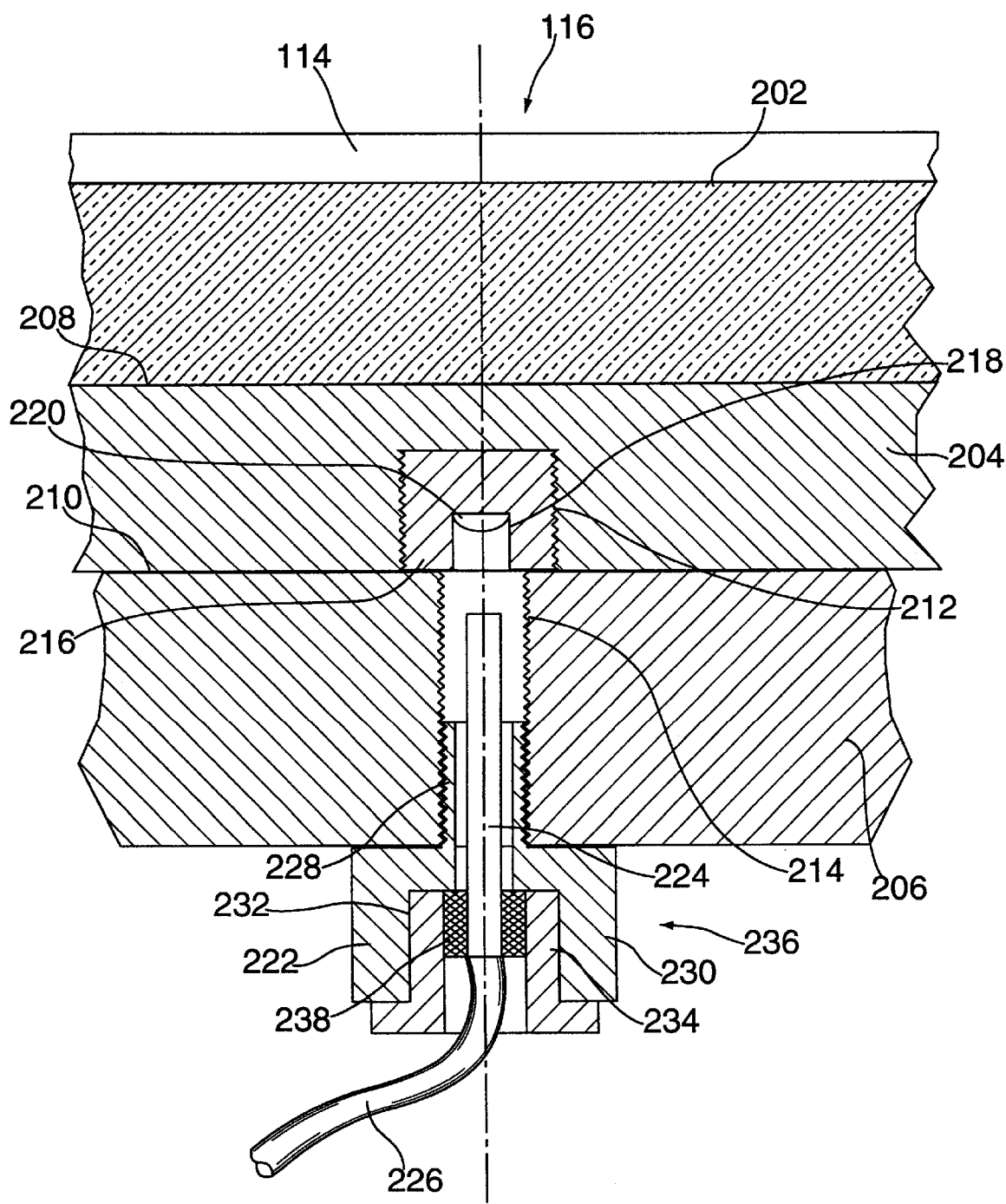
FIG. 2 is a cross-sectional schematic of the support assembly of the subject invention.

One embodiment of the support assembly 116 is depicted in greater detail in FIG. 2. The support assembly 116 has a substrate support or puck 202, a pedestal 204 and a bulkhead 206. The puck 202 supports the substrate 114 during processing. The puck 202 may be a ceramic body, a heater, an electrostatic chuck, or the like. Disposed below the puck 202 is the pedestal 204. The pedestal 204 is fabricated from a material having good thermal conductivity, such as stainless steel or aluminum. The pedestal 204 has an upper surface 208 in contact with the puck 202 and a lower surface 210. A blind hole 212 is provided in the lower surface 210. The blind hole 212 is configured to engage a removable, modular plug 216. For example, in one embodiment, the blind hole 212 is 6 mm in diameter by 2.5 mm deep. Of course, the dimensions of the blind hole 212 may be readily varied to accommodate different size plugs 216. However, utilizing smaller sizes (i.e., less than 6 mm in diameter) promotes increased temperature uniformity and rapid response to temperature changes between the plug 216 and pedestal 204. The bulkhead 206 holds the pedestal 204 against the puck 202. The bulkhead 206 contains a threaded through hole 214 that is axially aligned with the blind hole 212.

The modular plug 216 is disposed within the blind hole 212. Generally, the plug 216 is sized substantially identical to the blind hole 212. Optionally, the plug 216 may extend beyond the blind hole 212. The plug 216 is retained in the blind hole 212 using a conventional thread form. In one embodiment, the plug 216 and blind hole 212 have a matching thread form wherein the plug 216 has a slot (not shown) to facilitate turning the plug 216 within the blind hole 212. Alternatively, the plug 216 may contain other features in place of the slot to facilitate the installation of the plug 216, such as wrench flats, hex, phillips, spanner and knurled heads. However, it should be noted that other means of retaining the plug 216 within the blind hole 212 may be alternately utilized in place of a thread form, such as retaining rings, retaining adhesives, brackets, detent pins, and the like. The plug 216 is fabricated from a material having good conductivity.

Additionally, the plug material should also be selected as to prevent gauling of the plug 216 and/or pedestal 204, i.e., the plug 216 should be copper or steel when the pedestal 204 is fabricated from aluminum alloys.

A bore 218 is axially disposed within the plug 216. Disposed at the bottom of the bore 218, is a layer of photoluminescent material 220. The photoluminescent material 220, such as phosphorous, has a rate of decay in luminescence from an exited state which correlates to temperature. The photoluminescent material 220 is disposed in a thin layer, i.e., about 0.25 mm thick, as not to incur thermal gradients. The photoluminescent material 220 may also contain a binder that is chemically compatible with photoluminescent material 220, and transparent to the wavelengths associated with the excitation and emission of the photoluminescent material 220. In one embodiment, the photoluminescent material 220 comprises phosphor power (part number 01-1108-01 available from Luxtron Corporation of Santa Clara, Calif.), and a few percent potassium silicide or spin on glass (SOG) binder (part number SOG 111 or SOG 512B, available from Applied Materials, Inc., Santa Clara, California). The powder and SOG are combined and applied to the plug 216, then baked until cured (approximately 100 degrees Celsius for 1 hour). One skilled in the art understands that other binders may be readily substituted, and alternately, a photoluminescent material with binder that is premixed and commercially available.

The plug 216 (with photoluminescent material 220 disposed within) is calibrated to measure temperature sensed by the plug 216 using conventional techniques known in the art for determining a fluorescence decay/temperature relationship. For obtaining temperature measurements with a reproducibility within ±1 degree Celsius, the time periods in which the decay in fluorescence is measured must be accurate within a few microseconds out of several milliseconds. Once the plug is calibrated, the accuracy of the temperature measurement exceeds ±1 degree Celsius without having to compensate for the particular probe 224. For example, a Luxtron Series 500 temperature board may be used to calibrate the plug 216 to ±0.5 degrees Celsius within ±50 degrees Celsius calibration points.

The probe assembly 236 is attached to the bulkhead 206 to obtain temperature readings from the plug 216. The probe assembly 236 comprises a connector 222, a coupler 234 and an optical probe 224. The probe 224 additionally has a lead 226 that is coupled to the controller 140 or other device capable of sending an excitation signal and measuring the rate of decay of the emitted phosphorescence. The connector 222 has a threaded portion 228 and a head 230. The threaded portion 228 engages the threaded through hole 214, seating the head 230 against the bulkhead 206. The head 230 has a central stepped passage 232. The optical probe 224 passes through the coupler 234, and is retained in the probe assembly 236 by using an adhesive 238, such as Torrseal® or like adhesives compatible for bonding the probe 224 to the coupler 234. As such, the probe assembly 236 holds the probe 224 substantially coaxial with the plug 216 and may be readily replaced when damaged, or salvaged from support assemblies needing maintenance, thus saving both hardware costs and service time. The reader should note that the probe 224 may alternately have position remote from the bulkhead 206 as long as the probe 224 and plug 216 are coaxial, enabling the probe 224 to detect the emitted glow as discussed below.

The probe 224 is fabricated from an optical quality fiber such as silica. The diameter of the probe 224 may be selected as to enhance the pick-up of the phosphorescent glow. For example, larger diameter probes allow the probe 224 to be positioned further away from the material 220. As such, the probe 224 is a "non-contact" probe, being not in contact with the material 220. In one embodiment, the probe diameter is 1 mm, enabling the probe 224 to be placed up to 6.35 mm away from the material 220. The probe 224 may utilize diameters down to 0.6 mm while retaining the ability to adequately transmit the glow signal when sufficiently close to the photoluminescent material 220. The reader should note that other methods of probe construction and mounting may be utilized as long as the alignment and distance of the probe 224 and material 220 are compatible with detecting and transmitting indicia of temperature, i.e., phosphorescent emittance.

The operation of the system 100 is best understood by referring to FIG. 1 and FIG. 2 simultaneously. One skilled in the art will recognize that the support assembly 116 can be advantageously utilized wherever temperature control and temperature uniformity of a wafer 114 is required and that the use in the system 100 is disclosed by way of example and is for illustration only. The wafer 114 is placed atop the puck 202 of the support assembly 116.

During the wafer 114 temperature stabilization process, the controller 140 sends an excitation signal through the probe 224. The excitation signal leaves the probe 224 and impinges upon the material 220, causing the material 220 to produce a phosphorescent glow that decays in intensity over time. The probe 224 retrieves the "glow decay" signal and returns it to the controller 140. The rate of decay is then correlated to the temperature of the material 220 (and support assembly 116), which is indicative of the wafer 114 temperature. Using this information, the controller 140 determines whether the wafer 114 requires heating or cooling, and initiates the appropriate action. If the wafer temperature is low, the wafer 114 is typically heated by an electrode to arrive at the predetermined temperature in approximately less than 20 seconds. If the wafer temperature is high, the wafer 114 is typically cooled by transferring heat from the wafer 114 through the pedestal 204 to the coolant provided by the fluid supply 154.

During processing, the wafer 114 is subjected to thermal energy from a variety of sources, e.g., from the plasma, the electrodes (not shown), and the like. To counteract the thermal energy impinging upon the wafer 114, thermal energy is removed from the wafer 114 by flowing coolant from the fluid supply 154 through the support assembly 116. In order to balance the thermal energy impinging upon and removed from the wafer 114, and maintain the predetermined processing temperature, the controller 140 utilizes the temperature measured at the plug 216 to determine whether the wafer 114 needs to be heated or cooled in the manner described above.

Thus, the ability of the plug 216 containing the photoluminescent material 220 to monitor wafer temperature results in an accurate and repeatable temperature reading that closely follows the wafer 114 temperature in real time, allowing the wafer 114 to be held precisely at the predetermined temperature throughout the entire wafer processing cycle. Additionally, since the plug 216 can be calibrated independent of the probe 224, the plug 216 may be removed and interchanged without having to match components or recalibrate the system. As such, the plug 216 may be readily replaced when damaged, or salvaged from support assemblies needed maintenance, thus saving both hardware costs and service time.

In an alternative embodiment, the photoluminescent material 220 may comprise materials that emit wavelengths that have a ratio of intensity that corresponding to the temperature. Examples of such material are gallium arsenide, activated lanthanum, gadolinium oxysulfide and others. When utilizing these types of materials, the probe 224 is selected to measure the intensity in different bandwidths of the emitted phosphorescence. The ratio of intensity between selected wavelengths analyzed by the controller and is correlated to temperature, thus monitoring of the wafer temperature.

Although various embodiments which incorporate the teachings of the present invention have been shown and described in detail herein, those skilled in the art can readily devise many other varied embodiments that still incorporate these teachings.

What is claimed is:

1. Apparatus for measuring temperature at a pedestal disposed in a semiconductor wafer processing system comprising:

a removable temperature dependent plug adapted to be disposed within the pedestal, said plug having a bore extending partially through said plug and terminating with a distal end;

a photoluminescent material affixed to said distal end of said bore; and means for receiving luminescent emissions from said photoluminescent material, wherein said luminescent emissions provide an indicia of said pedestal temperature.

2. The apparatus of claim 1, wherein said plug is further provided with a threaded portion circumscribing an outer surface of said plug.

3. The apparatus of claim 2 wherein said threaded portion communicates with the pedestal.

4. The apparatus of claim 1, wherein said receiving means is spaced a distance from said photoluminescent material.

5. The apparatus of claim 1, wherein said receiving means comprises at least one optical fiber.

6. The apparatus of claim 1, wherein said bore is disposed axially along said plug.

7. The apparatus of claim 1, wherein said photoluminescent material is about 0.25.mm thick.

8. The apparatus of claim 1, wherein said plug is fabricated from a material selected from the group consisting of copper and steel.

9. The apparatus of claim 1 wherein said photoluminescent material is combined phosphor and spin on glass.

10. The apparatus of claim 1, wherein said photoluminescent material has a decay in luminescent emission in response to an excitation signal that is indicative of the temperature of the pedestal.

11. The apparatus of claim 4, wherein said receiving means is coaxially aligned with said plug.

12. The apparatus of claim 1, wherein said pedestal is selected from the group consisting of a ceramic body, a heater, and an electrostatic chuck.

13. The apparatus of claim 1, wherein said pedestal further comprises:

a plate;

a blind hole disposed in said plate, said plug disposed in said blind hole;

a bulkhead disposed proximate to said plate, said bulkhead having a hole coaxial to said blind hole; and said receiving means further comprises a probe assembly, mounted coaxial to said blind hole and said bulkhead hole.

14. The apparatus of claim 13 further comprising:

a controller coupled to said probe assembly.

15. The apparatus of claim 13 wherein the probe assembly is spaced a distance from said photoluminescent material.

16. Apparatus for sensing temperature comprising:
an optical probe;
a plug disposed coaxial to said optical probe, said plug having a bore extending partially through said plug and terminating with a distal end; and
a photoluminescent material affixed to said distal end of said bore, wherein said optical probe senses the temperature based on luminescent emissions from the photoluminescent material.

17. The apparatus of claim 16 further comprising:
a coupler, retaining at least a portion of said probe; and
a connector having a threaded portion and a stepped passage, said coupler at least partially disposed in said stepped passage.

18. The apparatus of claim 16, wherein said optical probe is spaced a distance from said photoluminescent material.

19. Apparatus for measuring a temperature of a substrate positioned on a substrate support having a blind hole, the apparatus comprising:
a removable plug disposed within said blind hole, said plug having a plug bore extending partially through said plug and terminating with a distal end;
a photoluminescent material affixed to said distal end in said bore of said plug;
a temperature probe assembly mounted substantially coaxial to said plug bore, wherein said temperature probe assembly receives luminescent emissions from said plug and provides an indication of said substrate temperature.

20. The apparatus of claim 19 further comprising:
a bulkhead having said probe assembly mounted thereto; and
a plate disposed between said substrate support and said bulkhead.

21. The apparatus of claim 19 further wherein the plug is fabricated from a material selected from the group of copper and steel.

22. The apparatus of claim 19 further comprising:
a controller coupled to said probe assembly.

23. The apparatus of claim 19, wherein said probe assembly is spaced a distance from said photoluminescent material.

24. The apparatus of claim 20, wherein said probe assembly further comprises:
a connector, having an external threaded portion and a stepped passage, said threaded portion engaging a threaded bore extending through said bulkhead;
a coupler, having a coupler bore and at least partially disposed within said stepped passage, said connector and coupler bores being axially aligned; and
an optical probe, extending through said coupler bore and stepped passage, and co-axially aligned with said plug bore.

* * * * *